United States Patent [19]
Rogers

[11] 4,017,806
[45] Apr. 12, 1977

[54] PHASE LOCKED OSCILLATOR
[75] Inventor: Bruce J. Rogers, Collegeville, Pa.
[73] Assignee: Sperry Rand Corporation, New York, N.Y.
[22] Filed: Jan. 26, 1976
[21] Appl. No.: 652,369
[52] U.S. Cl. .............................. 331/1 A; 329/107; 331/23; 331/25
[51] Int. Cl.² ......................................... H03B 3/04
[58] Field of Search ............... 331/1 A, 18, 23, 25; 329/104, 107

[56] References Cited
UNITED STATES PATENTS

| 3,731,220 | 5/1973 | Besenfelder | 331/1 A |
| 3,898,574 | 8/1975 | Allen et al. | 329/104 |
| 3,939,438 | 2/1976 | Taylor | 331/1 A X |

Primary Examiner—Siegfried H. Grimm
Attorney, Agent, or Firm—E. T. Battjer

[57] ABSTRACT

A phase locked oscillator comprising a phase comparator, filter and voltage controlled oscillator coupled in conventional manner to form the forward path of the phase locked loop and a counter and logic circuit coupled to form the feedback path. An input pulse stream is applied to a monostable flip flop which responds to each input pulse to produce a pulse of predetermined length that is applied to one input of the phase comparator. The counter is coupled to receive the oscillator output pulses for counting repetitively to a predetermined count. The logic circuit responds to first and second counts in the predetermined count for respectively generating and terminating a reference pulse in response to each input pulse. The reference pulse is applied to the other input of the phase comparator which in turn provides an output signal indicative of the time displacement between each input pulse and its associated reference pulse to control the oscillator to run at a harmonic frequency of the input pulse stream.

10 Claims, 5 Drawing Figures

PHASE LOCKED OSCILLATOR

BACKGROUND OF THE INVENTION

1. Field of Invention

This invention relates generally to phase locked oscillators and more particularly to improvements therein for reducing the cost and complexity of such devices adapted primarily for use in data processing applications.

2. Description of Prior Art

The use of phase locked oscillators in digital data processing systems is well known to those skilled in the art. In such systems the phase locked oscillator serves to track input data pulses, supplied for example from a magnetic read head, for the purpose of recovering recorded data. It is generally desired that the data bits be recorded as densely as possible in the interest of increasing the storage capacity of the recording media. As a consequence of this dense storage or high packing density, the read pulses representative of the respective data bits may be shifted from their appropriate positions relative to one another. Bit shift is caused by an interaction of each read pulse with adjacent read pulses. The amount of bit shift which may occur is dependent on the packing density and the data pattern. In the case of a data pattern where the pulses are uniformly or periodically spaced from one another, the bit shift, if any, is usually inconsequential. On the other hand, where the data pattern is nonuniform or aperiodic, the individual pulses are shifted in proportion to both the nominal spacing between pulses and the difference in spacing of each pulse from the immediately adjacent pulses on each side thereof with the bit shift being greater for relatively closely spaced pulses and less for relatively widely spaced pulses having the same space differential.

In recognition of the bit shift problem, the development of the magnetic data recording and recovery art has been concerned with the generation of encoding techniques which not only reduce the bit shift but also afford self-clocking for eliminating the need for a separate clock track on the recording medium. NRZ code, for example, which is characterized by a change from one signal level to another on the occurrence of a one data bit following a zero data bit and by a change back to the original signal level when a zero follows a one, is not capable of selfclocking because of the long interval which exists between signal transitions for a succession of either ones or zeros. Phase modulation (PM) code, which is characterized by a signal transition in one direction for a one bit and a signal transition in the opposite direction for a zero bit, assures the frequent occurrence of signal transitions and therefore is capable of self-clocking. However, signal transitions are also required between ones and zeros to assure that the one and zero signal transitions are made in the proper direction. The need for these additional transitions intermediate the data bit transitions aggravates the bit shift problem. Frequency modulation (FM) code is characterized by advantages and limitations similar to those of PM code. Another encoding technique commonly known as modified frequency modulation (MFM) eliminates the transitions between data bits and also avoids long intervals without any transitions, thereby affording the advantages of both high packing density and self-clocking. A variation of the MFM code known as doubly modified frequency modulation ($M^2FM$) also affords both of these advantages and is preferred for one reason or another in some instances.

In both MFM and $M^2FM$ encoded systems, one bits are recorded and reproduced at one time in a bit cell or interval, for instance, at the center thereof while zero bits are recorded and reproduced in accordance with specific encoding rules so as to occur at another time in the bit cell, for instance, at the leading or trailing edge. The specific encoding rules determine those zeros which are recorded and those which are not recorded. In other words, zeros are recorded only as necessary to achieve self-clocking. Upon read-out from the recording medium, both the ones and the recorded zeros are reproduced, so the data recovery apparatus must operate in a manner to respond to the reproduced ones and disregard the reproduced zeros.

The present invention will be described in relation to recovery of $M^2FM$ encoded data which will be explained subsequently in greater detail by reference to the drawings provided herewith for use in conjunction with the description of the preferred embodiment. In any event, from the foregoing comments concerning bit shift and a scrutiny of the accompanying drawings, it will be appreciated, as is indeed the case, that one bits of $M^2FM$ code tend to be shifted more than zero bits. This characteristic of the bit shift of $M^2FM$ encoded data can be used to advantage for enhancing data recovery.

In a data recovery system employing a phase locked oscillator, the oscillator functions to provide a reference signal which is fed back for phase comparison with an input signal representative of the input data bits to control the frequency of the oscillator such that it tracks the input signal. The oscillator thus inherently generates a data recovery gating signal. This gating signal is typically symmetrical, that is, it has a fifty percent duty cycle so it is at one level half the time in each cycle for gating or recovering one bits and is at another level for the remainder of each cycle during the time when zero bits may be present. By the use of appropriate logic circuits responsive to the gating signal, zero bits are blocked so that the recovered signal is representative only of the one bits present in the originally recorded data pattern. In the case of $M^2FM$ code where it is known that one bits tend to be shifted more than zero bits, it has been recognized that data recovery can be improved by allocating more than fifty percent of the data recovery gating signal cycle to recovery of one bits and proportionately less to the interval in which zero bits may be present. This is accomplished by the provision of an asymmetrical data recovery gating signal. Heretofore, systems operating in this fashion have been constructed with analog circuits coupled in the phase locked oscillator feedback path comprising the connection between the output of the oscillator and the input of the phase comparator with the attendant requirement for precision components to achieve desired accurracy, thereby making the systems complex and expensive to produce and maintain.

In accordance with the principles of the present invention, a phase locked oscillator is provided comprising digital components for producing the phase comparator reference signal and asymmetrical data recovery signal. The digital circuit component construction of the feedback path in accordance with the teaching of the instant invention significantly reduces system complexity with a concomitant reduction in manufacturing and maintenance costs.

SUMMARY OF THE INVENTION

A preferred embodiment of the present invention comprises a phase comparator, a monostable flip flop for converting each pulse of an input pulse stream to a pulse of predetermined duration which is applied as a variable position input to the phase comparator, a voltage controlled oscillator for providing a series of oscillator pulses, a filter coupling the phase comparator output to the input of the voltage controlled oscillator, a multistage binary counter coupled to receive the oscillator pulses for counting repetitively to a predetermined count, and logic circuitry responsive to first and second counts in the predetermined count for respectively generating and terminating a reference input to the phase comparator in response to each input pulse. The phase comparator provides a signal indicative of the time displacement between the termination of the variable and reference inputs for controlling the oscillator to run at a harmonic of the input pulse stream. In the case of an aperiodic input signal where the input pulses each occur in a respective time interval, either approximately at the center or a boundary thereof, first and second counts in the predetermined count serve to provide the reference pulse relating to the center pulses while third and fourth counts in the predetermined count serve to provide the reference pulse relating to the boundary pulses. This will be understood more fully from a reading of the following detailed description of the preferred embodiment.

BRIEF DESCRIPTION OF THE DRAWINGS

The operation of the preferred embodiment of the invention is described with reference to the accompanying drawings wherein:

FIG. 5 is a table illustrating the binary count notation for the repetitive decimal count used in the preferred embodiment.

DESCRIPTION OF THE PREFERRED EMBODIMENT

As mentioned hereinbefore, the preferred embodiment of the invention will be described with reference to recovery of an M²FM encoded signal which may be obtained for example by read-out from a magnetic disc and supplied as an input data pulse stream to the data recovery apparatus shown in FIG. 1. An illustrative M²FM encoded data pattern and the related input data pulse stream are shown in FIG. 2, from which it will be appreciated that 1 data bits are represented by a pulse at the center of a timing interval (bit cell) and 0 bits are represented by a pulse at the boundary of a timing interval. Each 1 data bit is represented by a pulse but 0 data bits are represented by a pulse only when neither a 1 or 0 bit is present in the immediately preceding timing interval. The minimum interval between pulses is T which occurs for successive 1 bits, and the maximum interval between pulses is 2.5T which occurs for a 1 bit following three successive 0 bits. Intermediate pulse intervals of 1.5T and 2T also occur in accordance with the pulse pattern.

Figure 1:
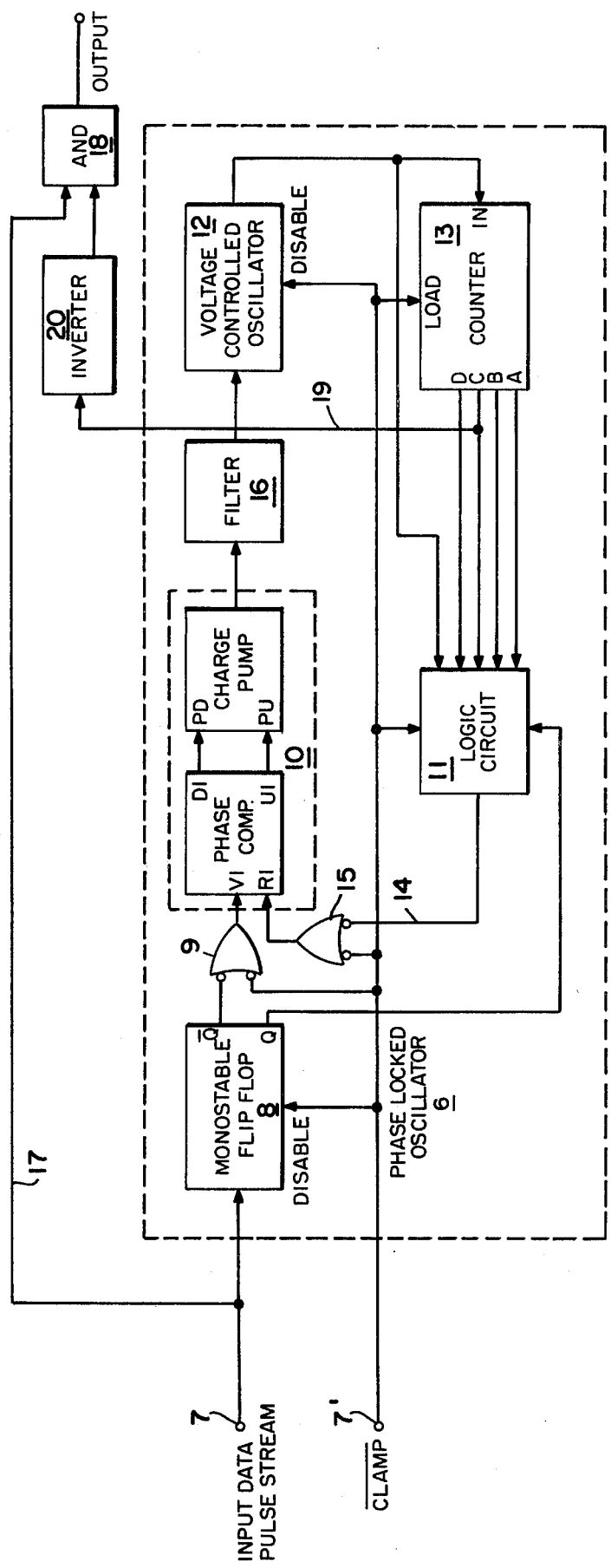
FIG. 1 is a block diagram of the phase locked oscillator of the present invention shown in the environment of a data recovery system.
Figure 2:
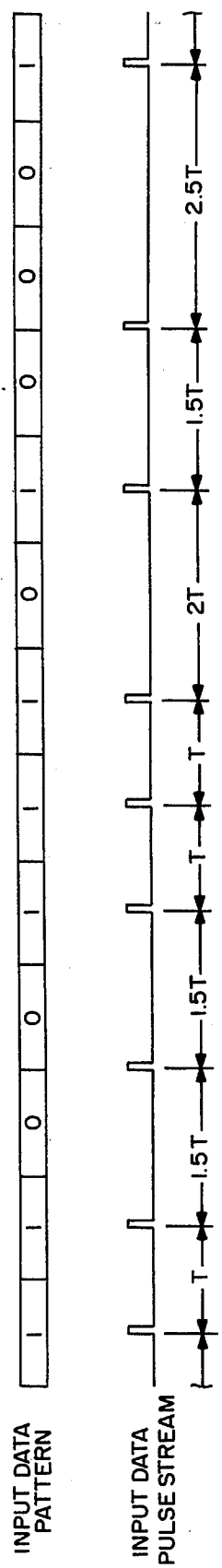
FIG. 2 depicts the input data waveform corresponding to the illustrated data pattern.
Figure 3:
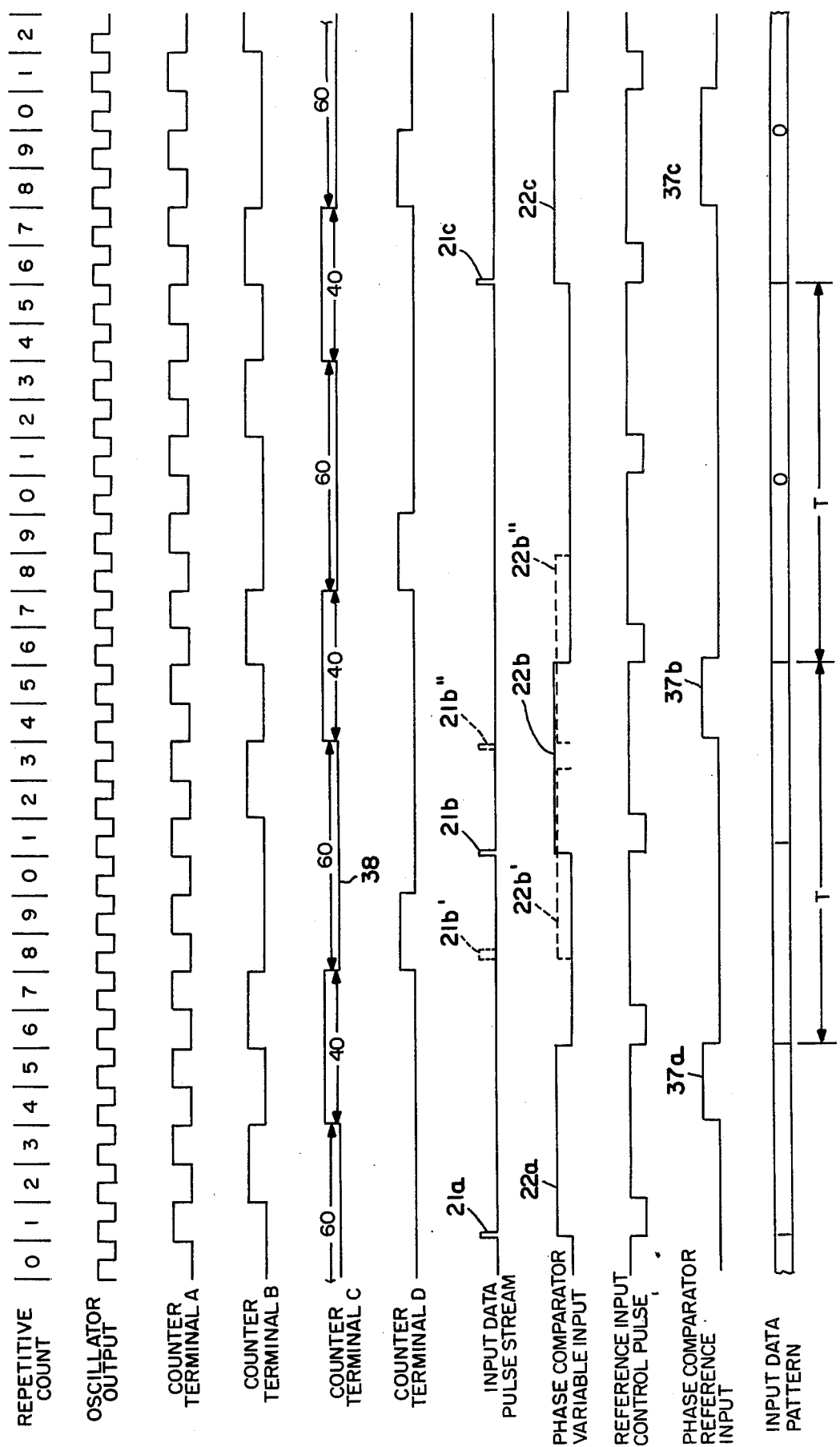
FIG. 3 depicts various waveforms useful in explaining the operation of the invention.

Refer now to FIGS. 1 and 3 where the latter depicts waveforms occurring at various points in phase locked oscillator 6 relative to the first four timing intervals from left to right in FIG. 2, only a part of the first and fourth timing intervals being shown in FIG. 3. The M²FM encoded input data pulse stream is applied to input terminal 7 of the phase locked oscillator. Monostable flip flop 8 serves to stretch each input data pulse to provide positive and negative elongated pulses at the Q and $\overline{Q}$ terminals thereof respectively. These elongated pulses have a duration equal to one-half the nominal value of T. During data recovery operation the $\overline{CLAMP}$ signal on terminal 7' is at a high level and thus inactive so the negative pulses at the $\overline{Q}$ terminal of flip flop 8 feed through negated input OR gate 9 to provide positive phase comparator variable input pulses as shown in FIG. 3, at the V1 input terminal of phase comparator and charge pump 10. Phase comparator and charge pump 10 is a Motorola model MC4044 integrated circuit coupled as shown in the drawing. The positive pulses provided at the Q terminal of flip flop 8 are applied to logic circuit 11 for reasons which will be described subsequently with reference to FIG. 4.

Voltage controlled oscillator 12 is controlled to run at a frequency which is a harmonic of the frequencies corresponding to the T, 1.5T, 2T and 2.5T spacings of the input data pulse stream. The oscillator output pulses are applied to the input terminal of counter 13 which is a four stage binary counter wired to count repetitively from zero to nine. The counter stages provide respective output signals at terminals A, B, C and D which vary in response to the applied oscillator input pulses in conventional binary fashion as shown in FIG. 5. Logic circuit 11 functions in response to the counter output signals to provide a phase comparator reference input pulse via lead 14 and negated input OR gate 15 to input terminal R1 of phase comparator and charge pump 10 for each input data pulse received at input terminal 7 of the phase locked oscillator. The phase comparator and charge pump compares the time displacement between the trailing edges of the phase comparator variable input and reference input pulses to provide at the output of the charge pump a phase error signal representative of such time displacement. This error signal in turn is applied through filter 16 to control the frequency of voltage controlled oscillator 12. In accordance with conventional phase locked oscillator operation, the gain and bandwidth of filter 16 is set during data recovery operation to respond to long term drift of the input data pulse stream occurring over several cycles thereof and so as not to respond to instantaneous jitter as caused, for instance, by bit shift which was discussed hereinbefore.

It will be noted that the signal at counter terminal C is asymetrical and has a 40/60 duty cycle. The 40 percent and 60 percent parts of the counter terminal C signal serve as data gating signals for 0 bits and 1 bits respectively. The 60 percent part of the counter terminal C signal which corresponds to the 1 bits to be recovered for the purpose of reproducing the data pattern is typically referred to as the recovery window. The phase locked oscillator functions in a manner to keep the recovery window centered on the 1 data bits irrespective of frequency variations of the input data pulse stream which cause either an increase or decrease of the nominal spacings between the data bits. In like manner, the 40 percent part of the counter terminal C signal is kept centered on the 0 data bits. As indicated in FIG. 3, the counter terminal C signal has a period T corresponding to the fundamental period of the input data pulse stream. If the frequency of the input data pulse stream decreases causing the spacings between the data bits to increase, voltage controlled oscillator 12 is varied to run at a lower frequency so that the period of the counter terminal C signal increases to correspond to the increased spacing between data bits; but the 40 and 60 percent parts thereof remain at such percentages for the increased period. Likewise, if the frequency of the input pulse data stream increases causing the spacings between data bits to decrease, the voltage controlled oscillator is varied to run at a higher frequency until the period of the counter terminal C counter signal decreases to correspond to the reduced spacing between the data bits, with the 40 and 60 percent parts again remaining at such percentages for the decreased period.

Recovery of the original data pattern is accomplished by feeding the input data pulse stream on lead 17 to one input terminal of AND gate 18 and feeding the counter terminal C signal on lead 19 through inverter 20 to the other input of AND gate 18. Coincidence of the inverted 60 percent recovery window with the 1 bits causes those bits to be transmitted through AND gate 18 whereas the 0 bits are blocked. Since the 60 percent recovery window occurs in the center of each timing interval, the absence of a 1 bit in any interval is indicative of a 0 bit for those intervals.

Figure 4:
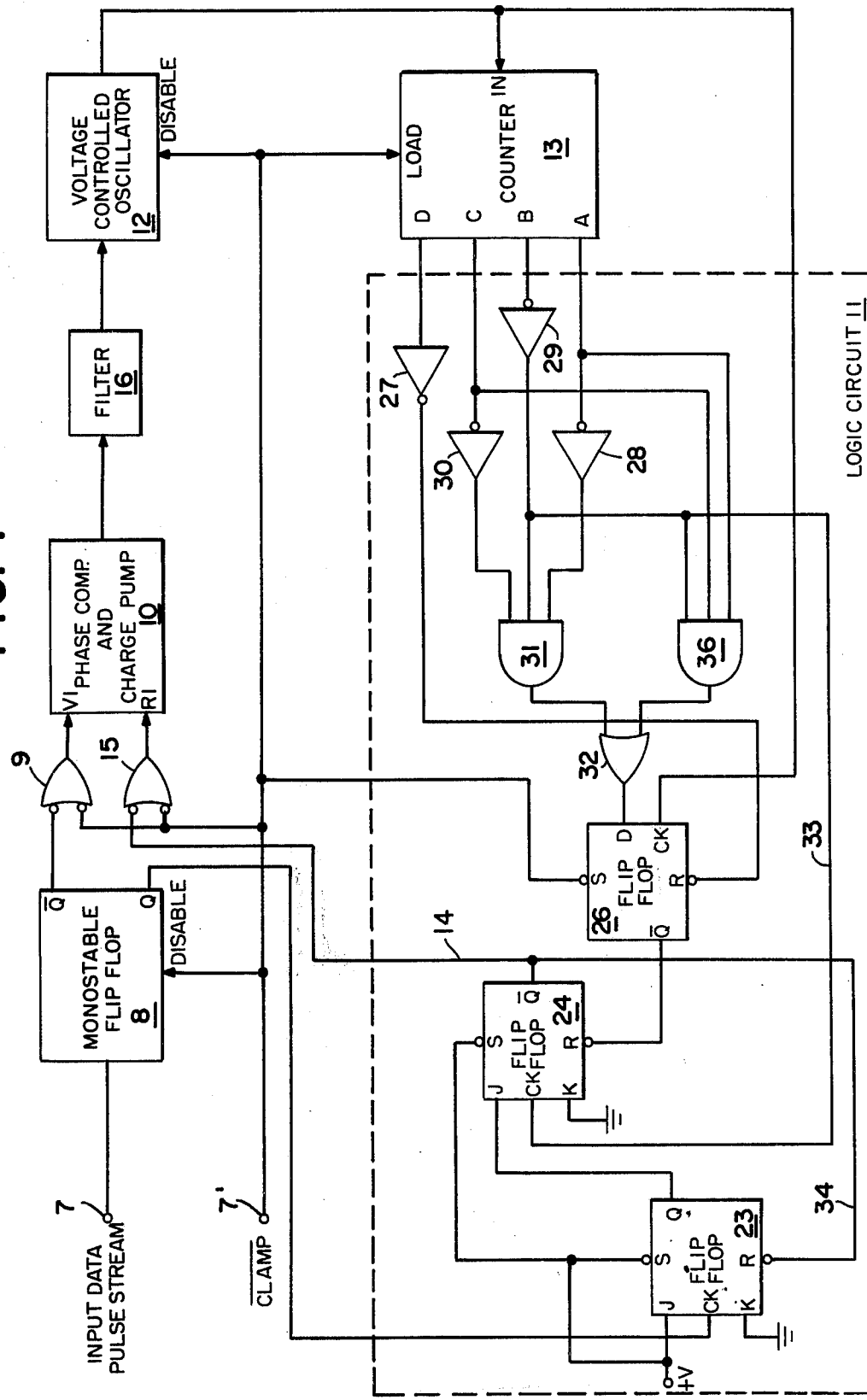
FIG. 4 depicts the phase locked oscillator of FIG. 1, showing the logic block thereof in greater detail.

The manner in which the phase locked oscillator and particularly the feedback portion thereof, comprising the counter and logic circuits, functions to slave the 60/40 gating signal to the input data pulses will now be described more specifically with reference to FIGS. 3, 4 and 5. It will be apparent that when the phase locked oscillator is initially switched into operation, the desired time relationship between the data bits and the respective parts of the recovery signal may not occur, that is, the 1 bits and 0 bits may not be coincident with the 60 and 40 percent parts respectively of the recovery gating signal. The manner in which this lock-in is accomplished will be described hereinafter. For the moment, though, to maintain continuity with the preceding discussion, it will be assumed that lock-in has been achieved so the 1 bits are in the 60 percent part and the 0 bits in the 40 percent part of the recovery signal. It will be further assumed that flip flops 23, 24 and 26 are initially set such that the signals the $\overline{Q}$ terminals thereof are high, and that voltage controlled oscillator 12 is running at a frequency ten times the frequency corresponding to the fundamental period T of the input data pulse stream. From the ensuing description, it will be appreciated that flip flops 23 and 24 do in fact initially settle with a high level signal at the $\overline{Q}$ terminals when the voltage controlled oscillator is running and no input pulses are applied to the phase locked oscillator, while the signal at the $\overline{Q}$ terminal of flip flop 26 is low at counts 1 and 6 and high for all other counts. Now consider the data recovery operation commencing with the reception of input data pulse 21a which is representative of a 1 bit occurring in the center of the 60 percent part of the recovery signal. For the assumed conditions, application of the data pulse 21a to input terminal 7 triggers monostable flip flop 8 producing at the $\overline{Q}$ terminal thereof an elongated negative pulse which is transmitted through negated input OR gate 9 to produce at the output thereof a positive phase comparator variable input signal 22a which is applied to terminal V1 of phase comparator and charge pump 10. The pulse produced at the $\overline{Q}$ terminal of flip flop 8 and the phase comparator variable input pulse 22a both have a duration equal to one-half the nominal timing interval T. Application of input data pulse 21a to flip flop 8 also produces at the Q terminal thereof a positive elongated pulse which is applied to the clock (CK) terminal of flip flop 23. The positive going leading edge of this clock signal drives the Q terminal of flip flop 23 to a high signal level which in turn is applied to the J terminal of flip flop 24. As indicated in the drawings, the leading edges of input data pulse 21a and the related phase comparator variable input pulse 22a coincide with count one of the repetitive count of counter 13. The manner in which the count of one is aligned with the input data pulse will be explained more fully in conjunction with the subsequent description of the lock-in operation.

Proceding now with the description of the operation in the recovery mode, at the count of four the signal at counter terminal B switches from a high (1) level to a low (0) level thereby providing a positive going signal at the output of inverter 29 which is coupled via line 33 to the clock terminal of flip flop 24 causing the signal at the $\overline{Q}$ terminal thereof to switch to a low level. This low level signal acts by way of line 34 to reset flip-flop 23 driving the signal at flip flop 23 terminal Q low. The low level signal at the $\overline{Q}$ terminal of flip flop 24 is also applied through negated input OR gate 15 to present a high level phase comparator reference input pulse 37a to terminal R1 of phase comparator and charge pump 10. At a count of five, the signal at counter terminals A and C is high and the signal at counter terminal B is low. The high level counter signals at terminals A and C are applied to AND gate 36 in coincidence with the high level signal provided at the output of inverter 29 to produce at the output of AND gate 36 a high level signal which is applied through OR gate 32 to the D terminal of flip flop 26. Thus, the next oscillator pulse, corresponding to count six, clocks flip flop 26 driving the signal at the $\overline{Q}$ terminal thereof low. This low level signal, referred to in the drawings as a reference input control pulse, resets flip flop 24 driving the signal at its terminal $\overline{Q}$ high and thereby terminating the phase comparator reference input pulse 37a. Now in this case where the input data pulse 21a has occurred at the center of the 60 percent recovery window, the phase comparator variable and reference input pulses terminate simultaneously so the phase comparator and charge pump 10 acts to produce a signal level at the output of filter 16 to maintain voltage controlled oscillator 12 at its nominal frequency as indicated in FIG. 3. The circuit operation is the same for input data pulse 21b which produces phase comparator variable input pulse 22b and phase comparator reference input pulse 37b which also terminate simultaneously as a consequence of input data pulse 22b being located at the center of its recovery window. Such action occurs because at the count of six the signal at the D terminal of flip flop 26 becomes low whereupon clocking thereof at count seven drives the signal at the $\overline{Q}$ terminal back to a high level. Then at the next count of zero the signals at counter terminals A, B, C and D are all simultaneously low and thus produce at the outputs of inverters 28, 29 and 30 simultaneously high level signals which are applied through AND gate 31 and OR gate 32 to provide a high level signal at the D terminal of flip flop 26 in readiness for clocking at the count of one occurring in coincidence with the reception of input pulse 21b.

When the input pulse occurs early in the recovery window as indicated by pulse 21b', the related phase comparator variable input pulse 22b', which is of predetermined duration as explained hereinbefore, terminates prior to the termination of the phase comparator reference input pulse 37b causing the phase comparator and charge pump 10 and filter 16 to change the oscillator frequency and cause the phase comparator reference input pulse to terminate simultaneously with the termination of phase comparator variable input pulse 22b'. It will be appreciated that this action causes the counter output signals to be shifted such that the center of recovery window 38 of the counter terminal C signal moves into coincidence with the leading edge of input data pulse 21b'. As previously mentioned, the time constant of filter 16 is typically selected so that shifting of the recovery window occurs only in response to a general drift in the same direction of all of the input data pulses 21a, 21b etc. Similar action occurs, with the recovery window being shifted in the opposite direction, when the data pulses occur late relative to the nominal location as indicated, for example, by pulse 21b''. In this instance the related phase comparator variable input pulse 22b'' terminates after the termination of the phase comparator reference input pulse 37b causing the oscillator frequency to change until the phase comparator reference input pulse terminates concurrently with the phase comparator variable input pulse 22b''.

In the case of a 0 bit, as represented by pulse 21c, a phase comparator variable input pulse 22c and a phase comparator reference input pulse 37c are produced for phase comparison as explained with reference to the 1 bits except that in this instance the counts of eight and one serve respectively to generate and terminate the phase comparator reference input pulse. On a count of eight the counter terminal B signal switches from a high (1) to a low (0) level, the same as it does on a count of four, for the purpose of initiating phase comparator reference input pulse 37c by clocking flip flop 24. On a count of one, phase comparator variable input pulse 37c is terminated by the clocking of flip flop 26 and resultant resetting of flip flop 24. Early and late occurrences of the 0 bits cause shifting of the recovery window in the same manner as explained for the 1 bits.

From the foregoing description it will be recognized that a phase comparator reference input pulse is produced for phase comparison with a phase comparator variable input pulse only when an input data pulse is present. In the absence of an input data pulse, neither a phase comparator variable input nor a phase comparator reference input pulse is produced for phase comparison and control of the voltage controlled oscillator. Thus, the phase locked oscillator operates satisfactorily for both periodic and aperiodic input pulse data streams.

Lock-in operation prior to data recovery may be accomplished as follows. Initially, a clock signal, derived for instance from a crystal oscillator providing precisely controlled periodic pulses at a nominal spacing T and corresponding to the clock used for recording the data on the magnetic disc is applied to input terminal 7 while the $\overline{\text{CLAMP}}$ signal is high and inactive. Phase locked oscillator 6 functions in response to the clock input signal in such a way that the signal at the output of filter 16 is set to a level representative of the center of the tolerance limits of the phase locked oscillator.

The magnetic disc on which the data may be recorded typically contains a preamble consisting of a sequence of 1 bits each spaced on interval T from adjacent bits. After the phase locked oscillator has settled at a quiescent state in response to the crystal oscillator pulses, the crystal oscillator is disconnected from the phase locked oscillator input and replaced by the preamble pulses. At the instant of applying the first preamble pulse, the $\overline{\text{CLAMP}}$ signal is switched to a low level. This disables monostable flip flop 8 so it does not respond to the preamble pulse, sets flip flop 26 driving the signal at its $\overline{Q}$ terminal low and provides simultaneous positive going pulses to input terminals V1 and R1 of phase comparator and charge pump 10. The $\overline{\text{CLAMP}}$ signal going low also disables voltage controlled oscillator 12 and loads a count of one into counter 13. At the occurrence of the next preamble pulse as determined, for example, by coincidence of such pulse and a delayed replica of the first preamble pulse, the $\overline{\text{CLAMP}}$ signal switches back to a high level. This removes the disable signal from flip flop 8 but not in time for it to respond to the instant preamble pulse. Hence, the $\overline{\text{CLAMP}}$ signal going high causes the signals at terminals V1 and R1 of the phase comparator and charge pump simultaneously to go low whereby the filter output signal remains at its quiescent value. The $\overline{\text{CLAMP}}$ signal going high also removes the disable signal from voltage controlled oscillator 12 permitting it to start oscillating after a delay of one cycle. A Texas Instrument Model 74S124 voltage controlled oscillator functions in this manner. Thereafter, some additional preamble pulses are applied to input terminal 7 and the phase locked oscillator responds as previously explained for data recovery, with the signal at the output of filter 16 settling at a quiescent value corresponding to the interval T between preamble pulses. This interval T may be greater or less than the interval between the crystal oscillator recording pulses depending on the speed of the magnetic disc during recovery relative to its speed during recording. After a predetermined number of preamble pulses the phase locked oscillator is then ready for recovery of data pulses.

While the invention has been described with reference to a specific embodiment, it will be apparent that improvements and modifications may be made within the purview of the invention without departing from the true spirit and scope thereof as defined in the appended claims.

I claim:

1. A phase locked oscillator comprising:
   means for supplying in response to an input pulse stream a series of input pulses each of predetermined duration,
   controllable oscillator means for providing a series of oscillator pulses,
   means for providing an asymetric cyclic pulse signal including a counter responsive to the oscillator pulses for repetitively counting to a predetermined count,
   means responsive to a first count in the predetermined count for generating a reference pulse in response to an input pulse, means responsive to a second count in the predetermined count for terminating the reference pulse, and comparator means for producing a signal representative of the time displacement between the termination of each input pulse and its related reference pulse to control said oscillator means so that the frequency of the oscillator pulses is an integral multiple of the frequencies corresponding to the spacings of the input pulses and the period of the asymmetric cyclic pulse signal is equal to the fundamental period of the input pulse stream.

2. The apparatus of claim 1 wherein the means responsive to the first count in the predetermined count includes bistable switch means which is switched from a first state to a second state to produce a reference pulse if an input pulse has been supplied.

3. The apparatus of claim 2 wherein said bistable switch means includes first and second bistable switches, the first bistable switch being switched from a first state to a second state at the occurrence of an input pulse for enabling the second bistable switch to be switched from a first state to a second state at the occurrence in the first count of the predetermined count to initiate the reference pulse and switch said first bistable switch back to its first state.

4. The apparatus of claim 3 wherein the means responsive to the second count in the predetermined count includes a third bistable switch which is switched from a first state to a second state at the occurrence of the second count for switching said second bistable switch back to its first state and thereby terminating the reference pulse.

5. The apparatus of claim 4 including means responsive to a count intermediate the second count and next occurrence of the first count for switching said third bistable switch back to its first bistable state.

6. The apparatus of claim 5 wherein the counter is a binary counter constructed and arranged to count to a base which is not a power of two and has a number of stages so that the asymmetric cyclic pulse signal is produced at one of the stages.

7. The apparatus of claim 6 wherein the input pulses of predetermined duration are supplied by a monostable switch which switches from a first state to a second state for a predetermined time in response to pulses of the input pulse stream.

8. The apparatus of claim 7 wherein the monostable switch is switched to the second state for an interval approximately equal to one-half the fundamental period of the input pulses.

9. The apparatus of claim 8 further including a filter coupling the phase comparator to the controllable oscillator for controlling the frequency of the oscillator in response to frequency and phase variations of the input pulses occurring over several cycles thereof but not in response to instantaneous frequency and phase variations of the input pulses.

10. The apparatus of claim 1 wherein the input pulse stream is aperiodic with the pulses thereof each occurring in respective intervals at spacings which are an integral multiple of the period corresponding to the frequency at which the oscillator is controlled to operate, the means responsive to the first count acts to generate a reference pulse for an input pulse normally occurring at approximately the center of an interval and is responsive to an additional count following the second count for generating a reference pulse for an input pulse normally occurring at approximately the boundary of an interval, and the means responsive to the second count acts to terminate a reference pulse relating to an input pulse normally occurring at approximately the center of an interval and is responsive to a further count intermediate the additional and first counts for terminating a reference pulse relating to an input pulse normally occurring at approximately the boundary of an interval.

* * * * *